(12) United States Patent
Song

(10) Patent No.: US 9,343,521 B2
(45) Date of Patent: May 17, 2016

(54) ORGANIC LIGHT-EMITTING DISPLAY APPARATUS AND METHOD OF MANUFACTUING THE SAME

(71) Applicant: Samsung Display Co., Ltd., Yongin, Gyeonggi-Do (KR)

(72) Inventor: Young-Rok Song, Yongin (KR)

(73) Assignee: Samsung Display Co., Ltd., Yongin, Gyeonggi-Do (KR)

(*) Notice: Subject to any disclaimer, the term of this patent is extended or adjusted under 35 U.S.C. 154(b) by 0 days.

(21) Appl. No.: 14/724,581

(22) Filed: May 28, 2015

(65) Prior Publication Data

US 2015/0263081 A1 Sep. 17, 2015

Related U.S. Application Data

(62) Division of application No. 14/065,103, filed on Oct. 28, 2013, now Pat. No. 9,076,747.

(30) Foreign Application Priority Data

May 29, 2013 (KR) .................. 10-2013-0061255

(51) Int. Cl.
*H01L 51/56* (2006.01)
*H01L 27/32* (2006.01)
*H01L 51/52* (2006.01)

(52) U.S. Cl.
CPC ........ *H01L 27/3276* (2013.01); *H01L 27/3246* (2013.01); *H01L 51/5206* (2013.01); *H01L 51/5221* (2013.01); *H01L 51/56* (2013.01); *H01L 51/5203* (2013.01); *H01L 2227/323* (2013.01)

(58) Field of Classification Search
CPC ............................. H01L 51/56; H01L 27/3276
USPC ........................................................ 257/40
See application file for complete search history.

(56) References Cited

U.S. PATENT DOCUMENTS

2011/0050604 A1 3/2011 Kwon et al.
2013/0200379 A1* 8/2013 You et al. ................. 257/59

FOREIGN PATENT DOCUMENTS

JP 2008-076803 A 4/2008
KR 10-2003-0057632 A 7/2003
KR 10-2011-0024531 A 3/2011

* cited by examiner

*Primary Examiner* — Marc Armand
(74) *Attorney, Agent, or Firm* — Knobbe Martens Olson & Bear LLP

(57) ABSTRACT

Provided is an organic light-emitting display apparatus including a thin-film transistor (TFT) that includes an active layer, a gate electrode, and source/drain electrodes; an organic light-emitting device that includes a pixel electrode which is connected to the TFT, an intermediate layer which includes a light-emitting layer, and an opposite electrode; and an opposite electrode contact unit in which the opposite electrode is electrically connected to a power wiring, wherein, with regard to the power wiring, a surface that contacts the opposite electrode is formed to have an embossed structure.

4 Claims, 6 Drawing Sheets

ORGANIC LIGHT-EMITTING DISPLAY APPARATUS AND METHOD OF MANUFACTUING THE SAME

CROSS-REFERENCE TO RELATED PATENT APPLICATION

This application is a divisional application which claims priority under 35 U.S.C. §120 from U.S. patent application Ser. No. 14/065,103, filed Oct. 28, 2013, which claims priority to and the benefit of Korean Patent Application No. 10-2013-0061255, filed on May 29, 2013, in the Korean Intellectual Property Office, the disclosure of each of which is incorporated herein in its entirety by reference.

BACKGROUND

1. Field

One or more aspects of the present embodiments relate to an organic light-emitting display apparatus, and more particularly, to an organic light-emitting display apparatus in which a structure of an area, in which an opposite electrode that faces a pixel electrode contacts a power wiring, is improved.

2. Description of the Related Technology

Generally, an organic light-emitting display apparatus includes a thin-film transistor (TFT) and an organic light-emitting device. The organic light-emitting display apparatus has a structure in which the organic light-emitting device receives an appropriate driving signal from the TFT and emits light, thus displaying a desired image.

The TFT has a structure in which an active layer, a gate electrode, and source/drain electrodes are stacked on a substrate. Accordingly, when a current is supplied to the gate electrode via a wiring that is formed on the substrate, a current flows through the source/drain electrodes via the active layer. At the same time, a current flows through a pixel electrode of the organic light-emitting device that is connected to the source/drain electrodes.

Additionally, the organic light-emitting device includes the pixel electrode, the opposite electrode that faces the pixel electrode, and a light-emitting layer that is interposed therebetween. In such a structure, if a current flows through the pixel electrode via the TFT as described above, a proper voltage is formed between the opposite electrode and the pixel electrode. Accordingly, light is emitted from the light-emitting layer, and thus an image is displayed.

In order to form a proper voltage in the light-emitting layer as described above, the opposite electrode needs to be connected to the power wiring so as to maintain a constant voltage. In this case, an opposite electrode contact unit, which is connected to the power wiring, may generate heat.

That is, the power wiring, which is generally connected to the opposite electrode, has a structure in which a plurality of wiring layers are stacked and one wiring layer, from among the plurality of wiring layers, is connected to the opposite electrode. The plurality of wiring layers may be formed by stacking a gate electrode or a source electrode of the TFT, which are included in a display unit of the organic light-emitting display apparatus. In a process of depositing an organic light-emitting material on a pixel area in the display unit of the organic light-emitting display apparatus, an organic light-emitting material is deposited on a substrate that is separate from a deposition source for a certain distance. Thus, the organic light-emitting material may be unwantedly mixed into an opposite electrode contact unit, which is a non-display area of the organic light-emitting display apparatus. In this case, the organic light-emitting material, which is deposited on the plurality of power wirings, may cause heat generation, and thus, resultantly cause a defect of a product.

Accordingly, in order to implement a more stable organic light-emitting display apparatus, an improved structure, in which deposition of an organic light-emitting material on the opposite electrode contact unit is prevented, is demanded.

SUMMARY

One or more aspects of the present embodiments provide an organic light-emitting display apparatus in which one surface of a power wiring is formed to have an embossed structure, so that, even when an organic material is mixed in an opposite electrode contact unit, an area in which the organic material is deposited on the power wiring is minimized.

According to an aspect of the present embodiments, there is provided an organic light-emitting display apparatus including: a thin-film transistor (TFT) that includes an active layer, a gate electrode, a source electrode and a drain electrode; an organic light-emitting device that includes a pixel electrode which is connected to the TFT, an intermediate layer which includes a light-emitting layer, and an opposite electrode; and an opposite electrode contact unit in which the opposite electrode is electrically connected to a power wiring, wherein, with regard to the power wiring, a surface that contacts the opposite electrode is formed to have an embossed structure.

The power wiring may include at least one or more wiring layers, and the at least one or more wiring layers may include a wiring layer that comprises the same material and on the same layer as the source/drain electrodes of the TFT.

The power wiring may include at least one or more wiring layers, and the at least one or more wiring layers may include a wiring layer that comprises a same material and on a same layer as the gate electrode of the TFT.

The one slope of the embossed structure may forms a specific angle with regard to a deposition source that deposits an intermediate layer of the organic light-emitting device.

The specific angle may be determined so that a deposition material, which is generated from the deposition source, reaches the one slope of the embossed structure in a vertical direction.

The one slope of the embossed structure may be formed to be vertical to the substrate of the organic light-emitting display apparatus.

The embossed structure may be formed in an engraving or embossing direction with respect to the opposite electrode.

The gate electrode may include an upper gate electrode and a lower gate electrode, and the lower gate electrode may be formed on a same layer as the pixel electrode of the organic light-emitting device.

The power wiring may include first through third wiring layers, the first through third wiring layers are sequentially formed in a direction toward the opposite electrode, the first wiring layer comprises a same material and on a same layer as the lower gate electrode, the second wiring layer comprises the same material and on the same layer as the lower gate electrode, and the third wiring layer comprises the same material and on the same layer as the source electrode and the drain electrode.

The pixel electrode, the lower gate electrode, or the first wiring layer may be formed to include one or more transparent metal oxides selected from the group consisting of indium tin oxide (ITO), indium zinc oxide (IZO), zinc oxide (ZnO), and indium oxide ($In_2O_3$).

The upper gate electrode or the third wiring layer may include one or more materials selected from the group consisting of silver (Ag), magnesium (Mg), aluminum (Al), platinum (Pt), palladium (Pd), gold (Au), nickel (Ni), neodymium (Nd), iridium (Ir), chrome (Cr), lithium (Li), calcium (Ca), molybdenum (Mo), titanium (Ti), tungsten (W), molybdenum tungsten (MoW), and copper (Cu).

The opposite electrode contact unit may be formed in a non-display area.

The organic light-emitting display apparatus may further include an interlayer insulating layer and a pixel-defining layer that are formed outside outside a portion of the power wiring which is included in the opposite electrode contact unit.

The power wiring may be electrically connected to the opposite electrode via a hole that is formed on the interlayer insulating layer and the pixel-defining layer.

The interlayer insulating layer may include an inorganic insulating material, and the pixel-defining layer may include an organic insulating material.

According to another aspect of the present embodiments, there is provided method of manufacturing an organic light-emitting display apparatus, the method including forming a first conductive layer and a second conductive layer on a substrate; patterning the first conductive layer and the second conductive layer to form a pixel electrode and a first wiring layer of a power wiring from the first conductive layer, and to form a second wiring layer of the power wiring from the second conductive layer; forming an interlayer insulating layer that includes a hole exposing a part of the pixel electrode and the second wiring layer; forming a third conductive layer on the interlayer insulating layer, and patterning the third conductive layer to form a third wiring layer of the power wiring that has an embossed structure on an upper surface of the power wiring; forming a pixel-defining layer exposing a part of the pixel electrode and the third wiring layer of the power wiring; and forming an opposite electrode on the pixel-defining layer in a form of a front electrode, and which is electrically connected to the third wiring layer of the power wiring.

The method includes, after the forming of the pixel-defining layer, depositing an intermediate layer, which includes a light-emitting layer, on the pixel electrode by using a deposition source, wherein one slope of the embossed structure forms a specific angle with regard to the deposition source.

The specific angle may be determined so that a deposition material, which is generated from the deposition source, reaches the one slope of the embossed structure in a vertical direction.

The one slope of the embossed structure may be formed to be vertical to the substrate.

According to another aspect of the present embodiments, there is provided an opposite electrode contact unit, including a power wiring that includes at least one or more wiring layers; and an opposite electrode that is electrically connected to the power wiring, wherein the opposite electrode contact unit is formed in a non-display area of an organic light-emitting display apparatus, and the power wiring has an embossed structure on one surface thereof in a direction of the opposite electrode.

BRIEF DESCRIPTION OF THE DRAWINGS

The above and other features and advantages of the present embodiments will become more apparent by describing in detail example embodiments thereof with reference to the attached drawings in which.

DETAILED DESCRIPTION

Figure 1:
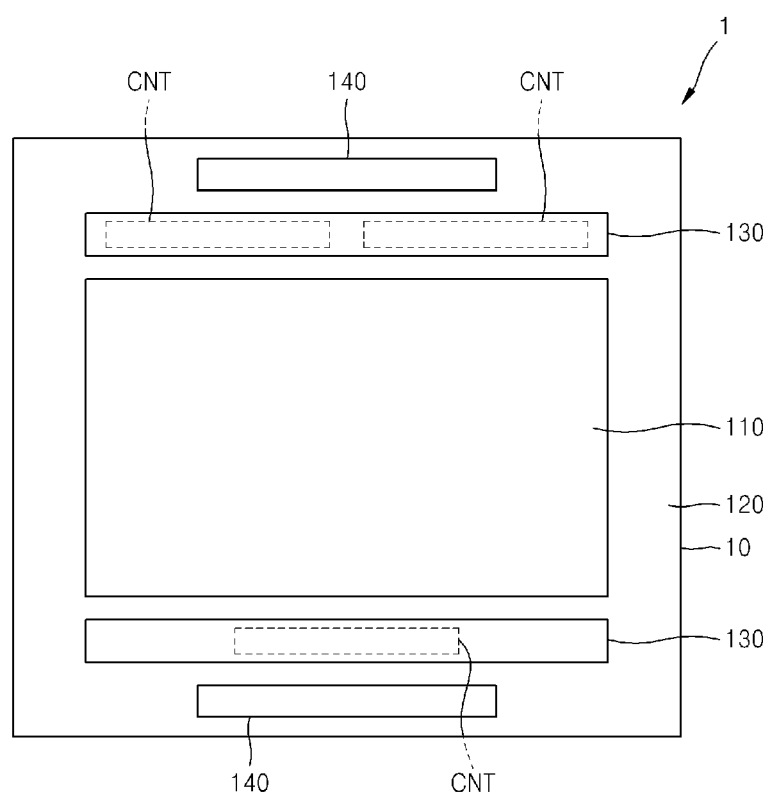
FIG. 1 is a schematic plan view illustrating a structure of an organic light-emitting display apparatus according to an embodiment.

In the following detailed description, reference is made to the accompanying drawings that show, by way of illustration, specific embodiments in which the embodiments may be practiced. These embodiments are described in sufficient detail to enable those skilled in the art to practice the embodiments. It is to be understood that the various embodiments, although different, are not necessarily mutually exclusive. For example, a particular feature, structure, or characteristic described herein, in connection with one embodiment, may be implemented within other embodiments without departing from the spirit and scope of the embodiments. In addition, it is to be understood that a location or arrangement of individual elements within each disclosed embodiment may be modified without departing from the spirit and scope of the embodiments. The following detailed description is, therefore, not to be taken in a limiting sense, and the scope of the present embodiments is defined only by the appended claims, appropriately interpreted, along with the full range of equivalents to which the claims are entitled. In the drawings, like numerals refer to elements having the same or similar functionality throughout the several views.

The present embodiments will now be described more fully with reference to the accompanying drawings, in which exemplary embodiments are shown.

FIG. 1 is a schematic plan view illustrating a structure of an organic light-emitting display apparatus 1 according to an embodiment.

The organic light-emitting display apparatus 1 includes a display area 110 in which a plurality of pixels are arranged on a substrate 10, and a non-display area 120 that is formed outside of the display area 110.

The substrate 10 may be a low-temperature poly-crystalline silicon (LTPS) substrate, a glass substrate, or a plastic substrate.

In the display area 110, a pixel (not shown), which forms a basic unit of a displayed image, is arranged in the form of matrix, and a wiring, which is electrically connected to each pixel, is formed. A pixel may include a pixel circuit, which includes at least one thin-film transistor (TFT) and a capacitor, and an organic light-emitting device EL. The organic light-emitting device EL has a structure in which a pixel electrode that is an anode electrode and is connected to the TFT, an organic emissive layer, and an opposite electrode that is a cathode electrode and is in the form of a front electrode are stacked. A cathode voltage is applied to each pixel via the opposite electrode.

The non-display area 120 may include an opposite electrode contact area 130 that is electrically connected to the opposite electrode (59, see FIG. 2) in the display area 110 via an opposite electrode contact unit CNT, and a pad area 140 in which a pad PAD (not shown) via which power is applied to the display area 110 and the opposite electrode contact area 130 is formed. The opposite electrode contact area 130 applies a cathode voltage, which is applied from the outside via the opposite electrode contact unit CNT, to each pixel via the pad PAD. One or more opposite electrode cathode areas 130 and pad areas 140 may be formed on at least one side of the non-display area 120. FIG. 1 illustrates an example in which the opposite electrode cathode area 130 and the pad area 140 are respectively formed on upper and lower parts of the non-display area 120. However, the present embodiments are not limited thereto. One or more opposite electrode contact units CNT may be formed in the opposite electrode cathode area 130.

According to an embodiment, an upper surface of a power wiring 30 (see FIGS. 4 through 6), which is included in the opposite electrode contact unit CNT, is formed to have an embossed structure. Thus, a resistance increase and heat generation, which may be caused by unintentional mixing of an organic material into the opposite electrode contact region, may be prevented.

The substrate 10 may be bonded to an encapsulation substrate (not illustrated), which faces the substrate 100, by using a sealing member (not illustrated) that is formed on the non-display area 120. Although not illustrated, the sealing member is formed on the substrate 10 so as to seal a light-emitting area. Thus, the light-emitting area may be protected from external air. For example, the sealing film may have a film growth structure formed by alternating a film consisting of an inorganic material such as silicon oxide or silicon nitride and a film consisting of an organic material such as epoxy or polyimide. As another example, the sealing film may include a film formed of low-melting glass such as tin oxide (SnO). However, this is only an example. The sealing film is not limited thereto, and any thin film with a sealing structure may be used as the sealing film.

Figure 2:
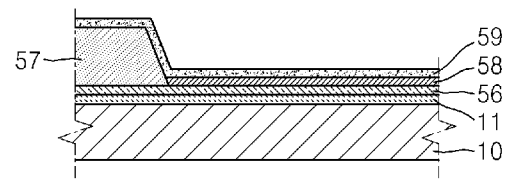
FIG. 2 is a schematic cross-sectional view illustrating a part of an opposite electrode contact area of a conventional organic light-emitting display apparatus.

FIG. 2 is a schematic cross-sectional view illustrating a part of an opposite electrode contact area of a conventional organic light-emitting display apparatus.

Referring to FIG. 2, with respect to an opposite electrode contact area included in the conventional organic light-emitting display apparatus, a buffer layer 11 is formed on the substrate 10, and a power wiring 56 is formed on the buffer layer 11. The opposite electrode 59 is formed on the power wiring 56. In this case, an organic material 58 may be unintentionally mixed between the power wiring 56 and the opposite electrode 59. In a process of forming the organic emissive layer in a pixel area, the organic material 58 may be unintentionally mixed into the opposite electrode contact unit. Then, an area in which the power wiring 56 directly contacts the opposite electrode 59 may be reduced, and thus, resistance therein may be increased. A problem of mixing of the organic material 58 may occur when an in-line deposition method, which may be desirably used for manufacturing a large organic light-emitting diode (OLED) panel, is used. This may increase resistance in an opposite electrode contact unit, and thus, generate heat.

Figure 3A:
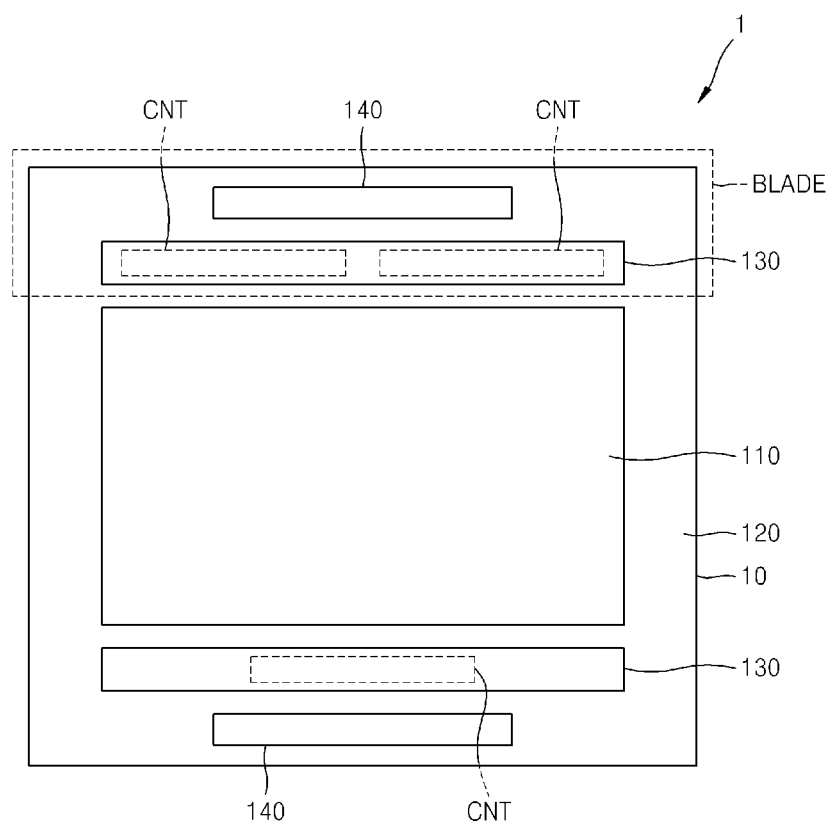
FIGS. 3A through 3C are schematic diagrams for explaining a method of depositing an organic material on the organic light-emitting display apparatus according to an embodiment.
Figure 3B:
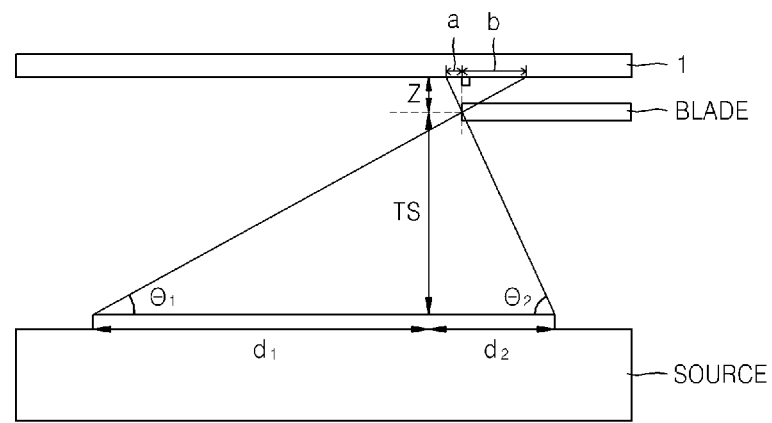
Figure 3C:
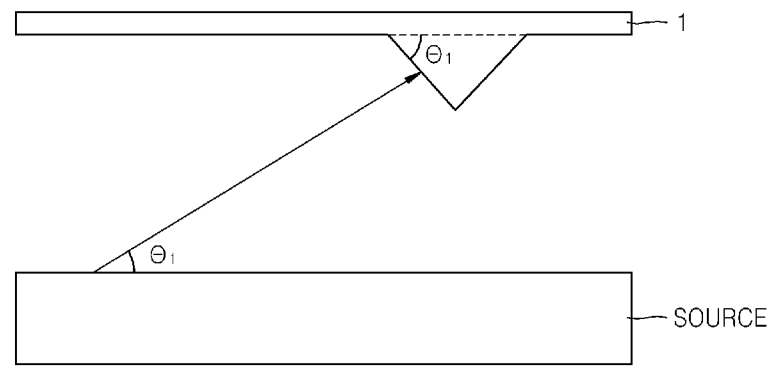

FIGS. 3A through 3C are schematic diagrams for explaining a method of depositing an organic material on the organic light-emitting display apparatus according to an embodiment.

FIG. 3A is a diagram illustrating a location in which, when an organic material is deposited, a blade BLADE is formed on the substrate 10. The organic material may be formed only in the display area 110. Accordingly, as shown in FIG. 3A, the blade BLADE is formed in a region covering the opposite electrode contact area 130 and the pad area 140, so that the organic material is not deposited in the opposite electrode contact area 130 and the pad area 140, which are in the non-display area 120. When a deposition material which is generated from a deposition source, that is, an organic material is formed on the substrate 10, the blade BLADE functions to prevent the organic material from being formed in the non-display area 120. A mask may be used, instead of the blade BLADE.

FIG. 3B is a diagram illustrating a reason why an organic material is deposited in the opposite electrode contact area 130, in spite of the use of the blade BLADE.

A deposition source SOURCE deposits a deposition material by using a tool such as a blade or a mask to distinguish a deposition area from a non-deposition area. In an example shown in FIG. 3B, an area b, which is covered by the blade BLADE, is a non-deposition area, and an area a, which is not covered by the blade BLADE, is a deposition area. It is assumed that a deposition material is sprayed from areas d1 and d2 of the deposition source SOURCE. Since the organic light-emitting display apparatus 1 is kept away from the blade BLADE by a distance Z. Accordingly, the deposition source SOURCE deposits an organic material when the deposition source SOURCE is separate from the substrate 10 by distances Z and TS, thus forming an intermediate layer 48 in the organic light-emitting device EL that will be described later. However, at the same time, the deposition source SOURCE also deposits the deposition material in the non-deposition area b, even when the blade BLADE is formed on the substrate 10. This is because the blade BLADE is kept away from the organic light-emitting display apparatus 1 by a certain distance. In an example shown in FIG. 3B, the deposition material may be unintentionally mixed into an area expressed by the equation b=(d1*Z)/TS.

FIG. 3C is a diagram illustrating a method of reducing an area in which a deposition material is mixed in the organic light-emitting display apparatus 1, according to an embodiment.

With regard to the organic light-emitting display apparatus 1 according to an embodiment, an embossed structure may be formed as shown in FIG. 3C. An angle between the deposition source SOURCE and an end of the blade BLADE is θ1 in the example shown in FIG. 3B. Then, according to an embodiment, an angle between the organic light-emitting display apparatus 1 and one slope of the embossed structure may be θ1. In such a case, a deposition material is not deposited on the other slope of the embossed structure of the organic light-emitting display apparatus 1. FIGS. 3B and 3C schematically illustrate a case in which a deposition material is mixed in the organic light-emitting display apparatus 1, accurately, FIGS. 3B and 3C illustrate a case in which a deposition material is mixed into the power wiring 30 of the cathode contact unit CNT. According to an embodiment, the power wiring 30 is formed to have an embossed structure (to be shown in FIGS. 4 through 6). Accordingly, a problem of heat generation may be solved by increasing an area in which the power wiring 30, which will be described later, directly contacts the opposite electrode 19.

Figure 4:
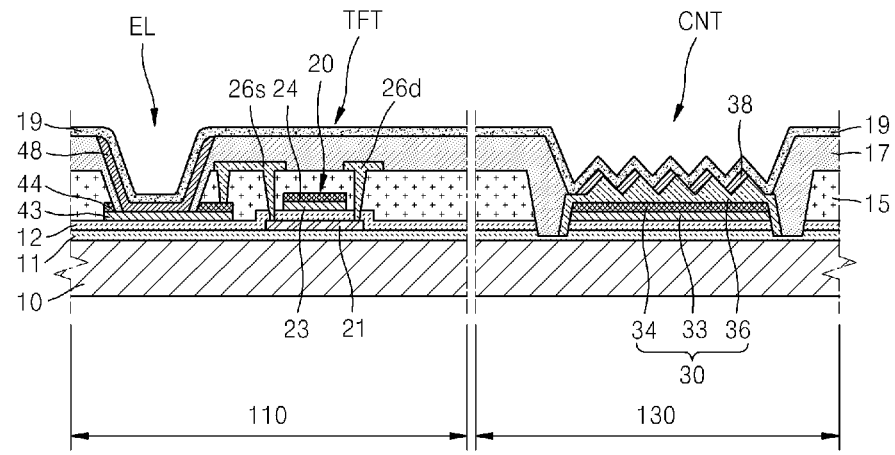
FIG. 4 is a diagram illustrating the organic light-emitting display apparatus according to an embodiment.

FIG. 4 is a diagram illustrating the organic light-emitting display apparatus according to an embodiment.

Referring to FIG. 4, according to an embodiment, an upper surface of the power wiring 30 of the opposite electrode contact unit CNT, included in the organic light-emitting display apparatus 1, is formed to have an embossed structure.

The organic light-emitting display apparatus 1 in the current embodiment includes the TFT, the organic-light emitting device EL, and the opposite electrode contact unit CNT in which the opposite electrode of the organic light-emitting device EL is connected to the power wiring 30.

The TFT consists of an active layer 21, a gate electrode 20, and source/drain electrodes 26s and 26d. The gate electrode 20 consists of a lower gate electrode 23 and an upper gate electrode 24. The lower gate electrode 23 comprises a transparent conductive material. The upper gate electrode 24 comprises metal. A gate insulating layer 12 is interposed between the gate electrode 20 and the active layer 21 so as to insulate the gate electrode 20 from the active layer 21. Additionally, source/drain areas, which have an electrical conductivity, are formed at both edges of the active layer 21, and are connected to the source/drain electrodes 26s and 26d.

The organic light-emitting device EL consists of a pixel electrode 43 that is electrically connected to one of the source/drain electrodes 26s and 26d of the TFT, the opposite electrode 19 that functions as a cathode, and the organic intermediate layer 48 that is interposed between the pixel electrode 43 and the opposite electrode 19. A reference numeral 15 refers to an interlayer insulating layer (hereinafter referred to as a first insulating layer), and a reference numeral 17 refers to a pixel-defining layer (hereinafter referred to as a second insulating layer).

Additionally, the opposite electrode contact unit CNT includes a first wiring layer 33, a second wiring layer 34, and a third wiring layer 36, as the power wiring 30 that contacts the opposite electrode 19. The first wiring layer 33 and the second wiring layer 34 comprise the same material and on the same respective layers as the lower gate electrode 23 and the upper gate electrode 24. The third wiring layer 36 comprises the same material and on the same layer as the source/drain electrodes 26s and 26d. Otherwise, according to another embodiment, a wiring layer of the power wiring 30 may comprise the same material and on the same layer as the gate electrode 20.

Referring to the embodiment shown in FIG. 4, the first insulating layer 15 is formed outside the power wiring 30, so as to be separate from the power wiring 30 with a space therebetween. The second insulating layer 17 is formed to fill the space between the power wiring 30 and the first insulating layer 15, and is formed to be interposed between the third wiring layer 36 and the opposite electrode 19. In FIG. 4, the second insulating layer 17 is formed to fill holes of a certain depth that are formed in) the gate insulating layer 12 and the buffer layer 11 on the substrate 10. However, the second insulating layer 17 is not limited thereto, and may be formed to fill only an upper part of the gate insulating layer 12. Additionally, according to the embodiment shown in FIG. 4, the first insulating layer 15 is illustrated to be separate from the power wiring 30. However, a space may not be provided between the first insulating layer 15 and the power wiring 30. Additionally, unlike the illustration in FIG. 4, the third wiring layer 36 may not cover ends of the first and second wiring layers 33 and 34, and may be formed only on an upper part of the first and second wiring layers 33 and 34.

According to an embodiment with reference to FIG. 4, since the third wiring layer 36 is formed to have an embossed structure, an organic material 38 is deposited only on one slope of the embossed structure. The organic material 38 may be a material that is deposited when the intermediate layer 48 is formed in the organic light-emitting device EL by using a deposition source. As described in detail with respect to FIG. 3C, the organic material 38 is deposited only on a surface that faces the deposition source SOURCE, in the embossed structure of the third wiring layer 36. Accordingly, compared to the opposite electrode contact unit CNT of the conventional organic light-emitting display apparatus, an area in which the third wiring layer 36 directly contacts the opposite electrode 19 is increased, and thus, heating resistance may be reduced.

More specifically, when the embossed structure is formed as illustrated in FIG. 3C, the deposition source SOURCE deposits a deposition material with a certain incident angle. Thus, the deposition material may be formed on only one slope of the embossed structure. That is, as illustrated in FIG. 3C, when a deposition material is deposited on the substrate 10 with an angle of θ1 from one end of the deposition source SOURCE, if an angle between one slope of the embossed structure and the substrate 10 is θ1, a deposition angle and an angle of a slope at one end of the third wiring layer 36 are perpendicular in direction to each other. Accordingly, a deposition material is deposited only on one slope of the embossed structure of the third wiring layer 36, and the deposition material may not be deposited on the other slope of the embossed structure. Therefore, an area in which the organic material 38, which is the deposition material, is deposited may be minimized, and thus an amount of generated heat may be reduced.

In the embodiment shown in FIG. 4, only an upper surface of the third wiring layer 36, from among the power wiring 30, is illustrated to have an embossed structure. However, according to another embodiment, the organic light-emitting display apparatus 1 may be formed so that all wiring layers of the power wiring 30 may respectively have an embossed shape. For example, unlike the embodiment shown in FIG. 4, in which only the third wiring layer 36 has an embossed shape, the first wiring layer 33, the second wiring layer 34, and the third wiring layer 36 may be formed to have an embossed shape. That is, with regard to the organic light-emitting display apparatus 1 in the present embodiments, some or all layers of the power wiring 30 may have an embossed shape. Resultantly, an upper surface of the power wiring 30 in a direction towards the opposite electrode 19 may have an embossed shape. Accordingly, even when the organic material 38 is mixed into the organic light-emitting display apparatus 1, the organic material 38 is deposited only on some slopes of the power wiring 30, and thus, heating resistance may be reduced.

FIGS. 5A through 5F are diagrams illustrating a method of manufacturing the organic light-emitting display apparatus of FIG. 4, according to an embodiment.

Figure 5A:
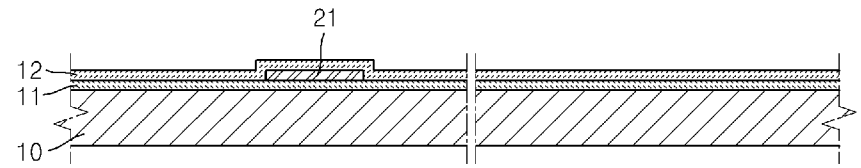
FIGS. 5A through 5F are diagrams illustrating a method of manufacturing the organic light-emitting display apparatus of FIG. 3, according to an embodiment.

Referring to FIG. 5A, the buffer layer 11 is formed on the substrate 10 so as to maintain a smoothness of the substrate 10 and prevent penetration of an impure element into the substrate 10.

The substrate 10 may comprise transparent glass having silicon dioxide ($SiO_2$) as a main component. However, the substrate 10 is not limited thereto, and may comprise various materials, such as transparent plastic, metal, and the like.

The active layer 21 of the TFT is formed on the buffer layer 11. The active layer 21 may comprise a polycrystalline silicon material, and is patterned by using a mask process. A material of the active layer 21 is not limited to silicon, and the active layer 21 may comprise an oxide semiconductor. For example, the active layer 21 may comprise a galium-indium-zinc-oxide (G-I—Z—O) layer [$(In_2O_3)a(Ga_2O_3)b(ZnO)c$ layer], where a, b, and c are real numbers, and a≥0, b≥0, and c<0. If the active layer 21 comprises an oxide semiconductor, a doping process, which will be explained hereinafter, may be omitted.

Then, the gate insulating layer 12 is formed on the patterned active layer 21. The gate insulating layer 12 may be formed by depositing an inorganic insulating layer such as silicon nitride ($SiN_x$) or silicon oxide ($SiO_x$) by using a method such as plasma-enhanced chemical vapor deposition (PECVD), atmospheric pressure chemical vapor deposition (APCVD), or low pressure CVD (LPCVD).

Figure 5B:
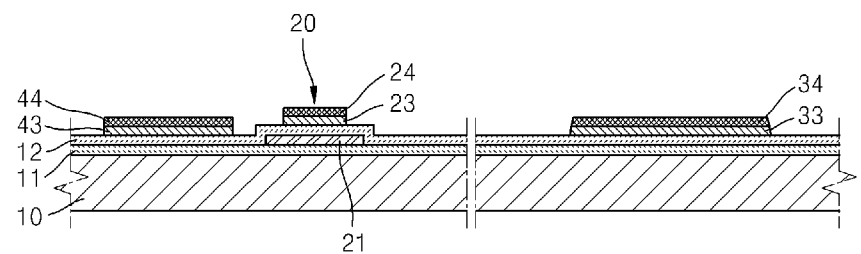

Then, as illustrated in FIG. 5B, a first conductive layer (not illustrated) and a second conductive layer (not illustrated) are sequentially deposited on the gate insulating layer 12. Then, the pixel electrode 43 and the auxiliary electrode 44 of the organic light-emitting device EL, the gate electrode 20 of the TFT, and the first wiring layer 33 and the second wiring layer 34 that form a part of the power wiring 30, which is included in the opposite electrode contact unit CNT, are patterned.

The first conductive layer (not illustrated) is patterned into the pixel electrode 43 of the organic light-emitting device EL, the lower gate electrode 23 of the TFT, and the first wiring layer 33 of the power wiring 30. The first conductive layer may include at least one material selected from the group consisting of transparent materials such as indium tin oxide (ITO), indium zinc oxide (IZO), zinc oxide (ZnO), and indium oxide ($In_2O_3$).

The second conductive layer (not illustrated) is patterned into the auxiliary electrode 44 of the organic light-emitting device EL, the upper gate electrode 24 of the TFT, and the second wiring layer 34 of the power wiring 30. The second conductive layer may include at least one material selected from silver (Ag), magnesium (Mg), aluminum (Al), platinum (Pt), palladium (Pd), gold (Au), nickel (Ni), neodymium (Nd), iridium (Ir), chrome (Cr), lithium (Li), calcium (Ca), molybdenum (Mo), titanium (Ti), tungsten (W), molybdenum tungsten (MoW), and aluminum/copper (Al/Cu).

The gate electrode 20 is formed at a location which corresponds to a center of the active layer 21. The active layer 21 is doped with an n-type or p-type impurity by using the gate electrode 20 as a mask. Then, a channel unit is formed in an area of the active layer 21 that is covered by the gate electrode 20, and source/drain units are formed in the other area of the active layer 21 that is not covered by the gate electrode 20.

Figure 5C:
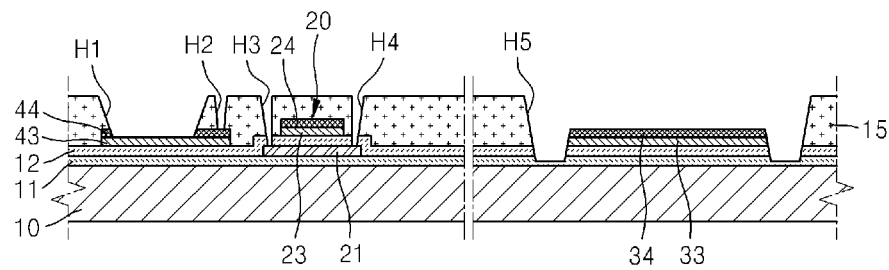

Then, referring to FIG. 5C, the first insulating layer 15 is deposited on an entire surface of the substrate 10, and holes H1 through H5 are formed by using a mask process.

The first insulating layer 15 may be formed by employing a spin coating method using at least one material selected from the group consisting of organic insulating materials such as polyimide, polyamide, acryl resin, benzo-cyclobutene (BCB), and phenolic resin. The first insulating layer 15 is formed to have a greater thickness than that of the gate insulating layer 12, thus functioning as an interlayer insulating layer between the gate electrode 20 and the source/drain electrodes 26s and 26d of the TFT. The first insulating layer 15 may be formed by using an inorganic insulating material, similar to the gate insulating layer 12, as well as the organic insulating material described above. The first insulating layer 15 may also be formed by alternating the organic insulating material and the inorganic insulating material.

The first insulating layer 15 is patterned to form the first hole H1 exposing a partial area of the pixel electrode 43 of the organic light-emitting device EL, the second hole H2 exposing a partial area of the auxiliary electrode 44, the third and fourth holes H3 and H4 exposing the active layer 21 of the TFT, and the fifth hole H5 exposing a partial or entire area of the power wiring 30 of the opposite electrode contact unit CNT. A periphery of the first wiring layer 33 and the second wiring layer 34 may be etched and carved to a certain depth of the gate insulating layer 12 and the buffer layer 11, and a space may be provided between the first wiring layer 33, the second wiring layer 34, and the first insulating layer 15. Otherwise, the present embodiments are not limited to the example shown in FIG. 5C, and the first insulating layer 15 may be etched so that a space is not provided between the first wiring layer 33, the second wiring layer 34, and the first insulating layer 15.

Figure 5D:
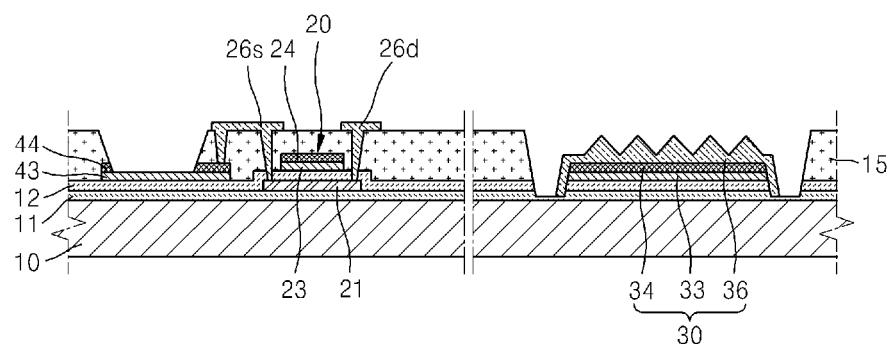

Then, referring to FIG. 5D, a third conductive layer (not illustrated) is deposited and patterned on an entire surface of the substrate 10 on the first insulating layer 15, thereby forming the source/drain electrodes 26s and 26d of the TFT and the third wiring layer 36 of the power wiring 30. The third conductive layer may be formed by using the same material selected from among the same conductive materials used for forming the first and second conductive layers, or formed of Mo/Al/Mo. The source/drain electrodes 26s and 26d and the third wiring layer 36 are formed by patterning the third conductive layer. The third wiring layer 36 is formed to cover ends of the first wiring layer 33 and the second wiring layer 34. Otherwise, the third wiring layer 36 may be formed on the second wiring layer 34, so as not to cover ends of the second wiring layer 34. Additionally, the auxiliary electrode 44 is etched to expose the pixel electrode 43. The electrode 26, which is one of the source/drain electrodes 26s and 26d, is connected to the auxiliary electrode 44.

According to an embodiment, the third wiring layer 36 may be formed to have an embossed structure so that an upper part of the power wiring 30 has an embossed structure. In order to form the third wiring layer 36 to have an embossed structure, a slit mask or a half-tone mask may be used as a mask for patterning the third conductive mask.

Figure 5E:
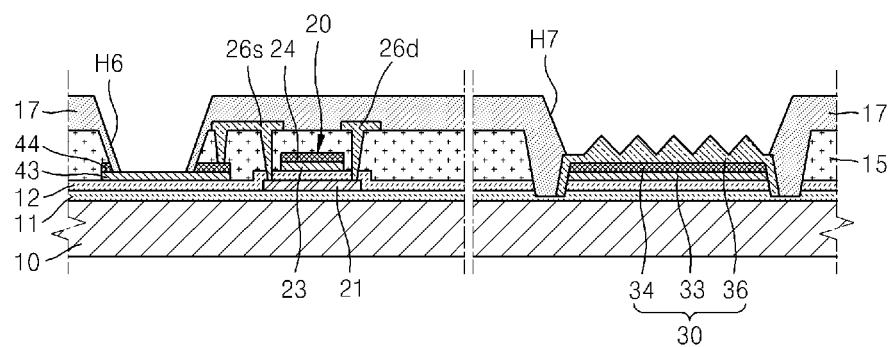

Then, referring to FIG. 5E, the second insulating layer 17 is formed on the substrate 10. The second insulating layer 17 may be formed by employing a spin coating method using at least one material selected from the group consisting of organic insulating materials such as polyimide, polyamide, acryl resin, BCB, and phenolic resin.

By patterning the second insulating layer 17, holes H6 and H7 respectively exposing a center unit of the pixel electrode 43 and the third wiring layer 36 are formed.

Figure 5F:
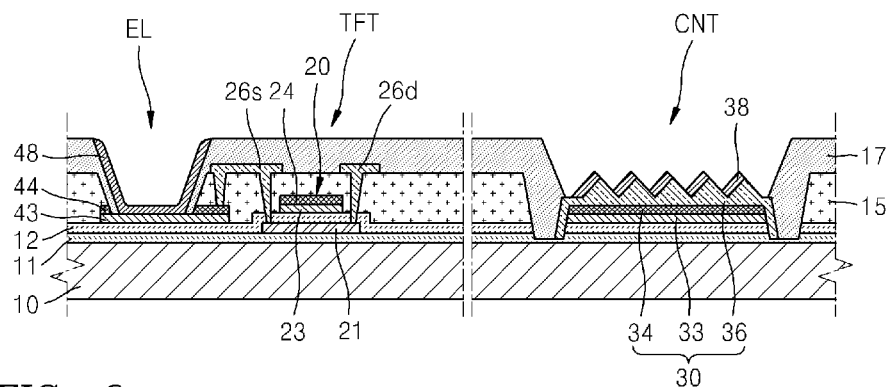

Then, as illustrated in FIG. 5F, the intermediate layer 48, which includes an emissive layer (EML), is formed in the hole H5 that exposes the pixel electrode 43. As described with regard to FIG. 3, in a process of forming the intermediate layer 48, the organic material 38 may be also deposited in the opposite electrode contact unit CNT.

The intermediate layer 48 may be formed by stacking one or more layers from among functional layers such as the EML, a hole transport layer (HTL), a hole injection layer (HIL), an electron transport layer (ETL), and an electron injection layer (EIL) to form a structure of a single or multiple layers.

The EML may include a low-molecular weight organic material or a polymer organic material. When the EML comprises a low-molecular weight organic material, the EML may be formed by stacking the HTL and the HIL in a direction from the EML to the pixel electrode 43 and stacking the ETL and the EIL in a direction from the EML to the opposite electrode 19. Besides, other layers may be stacked as desired. Other organic materials such as copper phthalocyanine (CuPc), N,N'-Di(naphthalene-1-yl)-N,N'-diphenyl-benzidine (NPB), and tris-8-hydroxyquinoline aluminum (Alq3) may be used.

In the case of the polymer EML that comprises a polymer organic material, the polymer EML includes only the HTL in addition to the EML. The HTL may be formed on the pixel electrode 43 by employing an ink jet printing method or a spin-coating method using poly-(2,4)-ethylene-dihydroxy thiophene (PEDOT) or polyaniline (PANI). The polymer EML may be formed by using polyphenylene vinylene (PPV), cyano-PPV, or polyfluorene.

In the embodiment described above, the intermediate layer 48 is formed in the hole H6, and an additional fluorescent material is formed for each pixel. However, the present embodiments are not limited thereto. The intermediate layer 48 may be formed on the entire second insulating layer 17 inside the display area 110, regardless of a location of the pixel. The EML may be formed, for example, by vertically stacking or mixing layers that include light-emitting materials which respectively emit red, green, and blue light. If white light can be emitted, other colors can be combined. Additionally, a color conversion layer that converts the emitted white light into a predetermined color, or a color filter may be further included.

Then, the opposite electrode 19 is formed entirely on the substrate 10. When the organic light-emitting display apparatus 1 is a bottom-emission type display apparatus which displays an image in a direction towards the substrate 10, the pixel electrode 43 may be a transparent electrode, and the opposite electrode 19 may be a reflective electrode. The reflective electrode may be formed by thinly depositing metal having a low work function, for example, Ag, Mg, Al, Pt, Pd, Au, Ni, Nd, Ir, Cr, Li, Ca, LiF/Ca, LiF/Al, or a combination thereof.

Conversely, when the organic light-emitting display apparatus 1 is a top-emission type display apparatus which emits light in an opposite direction to the substrate, the pixel electrode 43 is a light reflective electrode and the opposite electrode is a light transmissive electrode. In this case, the pixel electrode 43 may further include a reflective layer formed of Ag, Mg, Al, Pt, Pd, Au, Ni, Nd, Ir, Cr, Li, ytterbium (Yb) or Ca. Then, the opposite electrode may be formed to include a transparent metal oxide such as ITO, IZO, ZnO, or $In_2O_3$ so as to allow light transmission. The opposite electrode may also comprise a thin film by using metal such as Ag, Mg, Al, Pt, Pd, Au, Ni, Nd, Ir, Cr, Li, or Ca.

The opposite electrode 19 is deposited on an entire surface of the substrate 10, and connected to the third wiring layer 36 of the power wiring 30 via the hole H7. According to an embodiment, an upper part of the power wiring 30 has an embossed structure. Accordingly, even when the organic material 36 is unintentionally mixed, the organic material 38 may be formed only on a partial slope of the third wiring layer 36. Thus, an area in which the power wiring 30 and the opposite electrode 19 contact each other may be increased. Additionally, since the area in which the power wiring 30 and the opposite electrode 19 contact each other is increased, an area of the opposite electrode contact area 130 and the non-display area 120 may be reduced.

Additionally, according to other embodiments, a shape of an embossed structure of the power wiring 30 may be variously formed.

Figure 6:
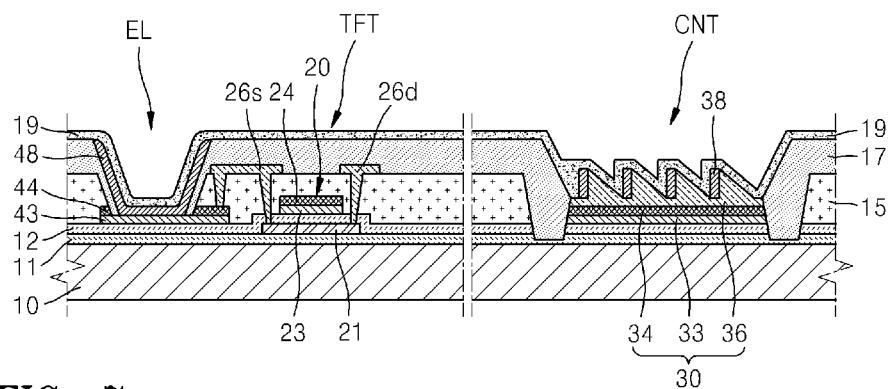
FIG. 6 is a diagram illustrating an organic light-emitting display apparatus 1 according to another embodiment.

FIG. 6 is a diagram illustrating the organic light-emitting display apparatus 1 according to another embodiment.

Referring to FIG. 6, unlike the embodiment shown in FIG. 4, one slope of the power wiring 30 is vertical to the substrate 10. In this case, the organic material 38 is deposited only on the slope that is vertical to the substrate 10. Thus, an area in which the opposite electrode 19 and the power wiring 30 contact each other may be increased.

Figure 7:
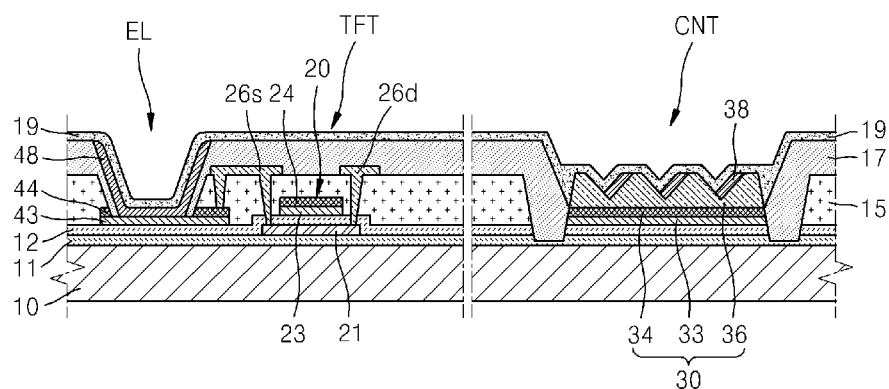
FIG. 7 is a diagram illustrating the organic light-emitting display apparatus 1 according to another embodiment.

FIG. 7 is a diagram illustrating the organic light-emitting display apparatus 1 according to another embodiment.

Referring to FIG. 7, unlike the embodiment shown in FIG. 4, an upper part of the power wiring 30 is formed to have an embossed structure in the engraved form.

According to the present embodiments, an area in which a power wiring and an opposite electrode contact each other is increased, and thus, ignition or deterioration, which may be caused by heat generation, may be prevented.

The particular implementations shown and described herein are illustrative examples of the embodiments and are not intended to otherwise limit the scope of the embodiments in any way. For the sake of brevity, conventional electronics, control systems, software development and other functional aspects of the systems (and components of the individual operating components of the systems) may not be described in detail. Furthermore, the connecting lines, or connectors shown in the various figures presented are intended to represent example functional relationships and/or physical or logical couplings between the various elements. It should be noted that many alternative or additional functional relationships, physical connections or logical connections may be present in a practical device. Moreover, no item or component is essential to the practice of the embodiments unless the element is specifically described as "essential" or "critical".

The use of the terms "a" and "an" and "the" and similar referents in the context of describing the embodiments (especially in the context of the following claims) are to be construed to cover both the singular and the plural. Furthermore, recitation of ranges of values herein are merely intended to function as a shorthand method of referring individually to each separate value falling within the range, unless otherwise indicated herein, and each separate value is incorporated into the specification as if it were individually recited herein. Finally, the steps of all methods described herein can be performed in any suitable order unless otherwise indicated herein or otherwise clearly contradicted by context. The use of any and all examples, or language (e.g., "such as") provided herein, is intended merely to better illuminate the embodiments and does not pose a limitation on the scope of the embodiments unless otherwise claimed. Additionally, it is to be appreciated that all changes, equivalents, and substitutes that do not depart from the spirit and technical scope of the present embodiments are encompassed in the present embodiments according to design conditions and factors.

The present embodiments have been described more fully with reference to the accompanying drawings, in which example embodiments are shown. The embodiments may, however, be embodied in many different forms and should not be construed as being limited to the embodiments set forth herein. It will be understood by those skilled in the art that various changes in form and details may be made therein without departing from the spirit and scope of the embodiments as defined by the appended claims.

Therefore, the scope of the embodiments is defined not by the detailed description of the embodiments but by the appended claims, and all differences within the scope will be construed as being included in the present embodiments.

What is claimed is:

1. A method of manufacturing an organic light-emitting display apparatus, the method comprising:
   forming a first conductive layer and a second conductive layer on a substrate;
   patterning the first conductive layer and the second conductive layer to form a pixel electrode and a first wiring layer of a power wiring from the first conductive layer, and to form a second wiring layer of the power wiring from the second conductive layer;

forming an interlayer insulating layer that comprises a hole exposing a part of the pixel electrode and the second wiring layer;

forming a third conductive layer on the interlayer insulating layer, and patterning the third conductive layer to form a third wiring layer of the power wiring that has an embossed structure on an upper surface of the power wiring;

forming a pixel-defining layer exposing a part of the pixel electrode and the third wiring layer of the power wiring; and forming an opposite electrode on the pixel-defining layer in the form of a front electrode, which is electrically connected to the third wiring layer of the power wiring.

2. The method of claim 1, further comprising, after the forming of the pixel-defining layer, depositing an intermediate layer, which comprises a light-emitting layer, on the pixel electrode using a deposition source, wherein one slope of the embossed structure forms a specific angle with regard to the deposition source.

3. The method of claim 2, wherein the specific angle is determined so that a deposition material, which is generated from the deposition source, reaches the one slope of the embossed structure in a vertical direction.

4. The method of claim 2, wherein the one slope of the embossed structure is formed to be vertical to the substrate.

\* \* \* \* \*